United States Patent
Iyengar et al.

(10) Patent No.: US 8,880,225 B2
(45) Date of Patent: Nov. 4, 2014

(54) DATA CENTER COOLING CONTROL

(75) Inventors: Madhusudan K. Iyengar, Woodstock, NY (US); Roger R. Schmidt, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 13/276,247

(22) Filed: Oct. 18, 2011

(65) Prior Publication Data

US 2013/0096721 A1    Apr. 18, 2013

(51) Int. Cl.
G05D 23/19  (2006.01)
H05K 7/20   (2006.01)

(52) U.S. Cl.
CPC ........ *H05K 7/20836* (2013.01); *G05D 23/1932* (2013.01)
USPC .......................................... 700/276; 700/300

(58) Field of Classification Search
USPC .......... 700/276, 299, 300; 713/300, 320, 321, 713/324
See application file for complete search history.

(56) References Cited

U.S. PATENT DOCUMENTS

| | | | | |
|---|---|---|---|---|
| 7,197,433 B2 * | 3/2007 | Patel et al. | ..................... | 702/188 |
| 7,210,048 B2 * | 4/2007 | Bodas | ............................ | 713/320 |
| 7,310,737 B2 * | 12/2007 | Patel et al. | ..................... | 713/300 |
| 7,313,461 B2 | 12/2007 | Sharma et al. | ................ | 700/259 |
| 7,472,558 B1 | 1/2009 | Narita | .............................. | 62/175 |
| 7,493,193 B2 | 2/2009 | Hyland et al. | ................ | 700/275 |
| 7,584,021 B2 | 9/2009 | Bash et al. | ..................... | 700/276 |
| 8,120,916 B2 * | 2/2012 | Schmidt et al. | ............... | 361/700 |
| 8,155,793 B2 * | 4/2012 | Nakajima et al. | ............. | 700/277 |
| 8,566,619 B2 * | 10/2013 | Athalye et al. | ................ | 713/300 |
| 8,639,482 B2 * | 1/2014 | Rasmussen et al. | ............. | 703/5 |
| 2004/0163001 A1 * | 8/2004 | Bodas | ........................... | 713/300 |
| 2004/0264124 A1 * | 12/2004 | Patel et al. | ..................... | 361/686 |
| 2005/0228618 A1 * | 10/2005 | Patel et al. | ..................... | 702/188 |
| 2005/0278070 A1 | 12/2005 | Bash et al. | ..................... | 700/276 |
| 2006/0214014 A1 | 9/2006 | Bash et al. | ..................... | 236/1 B |
| 2006/0225446 A1 | 10/2006 | Bash et al. | ....................... | 62/178 |
| 2007/0174024 A1 * | 7/2007 | Rasmussen et al. | ............. | 703/1 |
| 2009/0150123 A1 * | 6/2009 | Archibald et al. | ................ | 703/1 |
| 2009/0199580 A1 | 8/2009 | Lyon | ............................... | 62/157 |
| 2011/0161712 A1 * | 6/2011 | Athalye et al. | ................ | 713/340 |

OTHER PUBLICATIONS

"Optimizing Datacenter Cooling Costs", IP.com number: IPCOM000187553D, Sep. 10, 2009.

Blazek et al., "Data centers revisited: Assessment of the energy impact of retrofits and technology trends in a high-density computing facility", Journal of Infrastructure Systems ( J. Infrastruct. Syst. ) (United States) 2004 , 10/3 (98-104), Sep. 20, 2004.

(Continued)

*Primary Examiner* — Charles Kasenge
(74) *Attorney, Agent, or Firm* — Margaret A. McNamara; Ido Tuchman

(57) ABSTRACT

A method, system, and computer program product for controlling data center cooling. In an example embodiment the method includes calculating, using a processor, an over-provisioning factor, where the over-provisioning factor is a function of a ratio of a rated cooling power to a calculated cooling power of a set of cooling units, the set of cooing units comprising at least one cooling unit. The method proceeds by adjusting the data-center cooling until the over-provisioning factor is substantially equal to a target over-provisioning factor.

17 Claims, 3 Drawing Sheets

(56) References Cited

OTHER PUBLICATIONS

Shah et al., "An exergy-based control strategy for computer room air-conditioning units in data centers Proceedings of the ASME Heat Transfer Division—2004", 2004 ASME International Mechanical Engineering Congress and Exposition, IMECE, Anaheim, CA United States, Nov. 13, 2004-Nov. 19, 2004.

Boucher et al., "Viability of Dynamic Cooling Control in a Data Center Environment", Journal of Electronic Packaging (Transactions of the ASME), v 128, n 2, p. 137-144, Jun. 2006.

* cited by examiner

DATA CENTER COOLING CONTROL

FIELD OF THE INVENTION

The present invention is directed to the field of computer systems, and more specifically to methods of controlling data center cooling to save energy or accommodate additional Information Technology (IT) workload.

BACKGROUND

A data center may require less air conditioning than the rated cooling of its Computer Room Air Conditioning (CRAC) units. Running more CRAC units than necessary causes energy to be wasted and the data center to operate inefficiently. Operating the CRAC units at their maximum motor speed (maximum air flow rate) can also be wasteful when it is possible to ramp down the motor speed.

SUMMARY

An example embodiment of the present invention is a system for controlling data center cooling. The system includes a set of cooling units, a processor coupled to the set of cooling units, and a memory coupled to the processor. The memory includes computer readable program code embodied on it which is configured to: calculate an over-provisioning factor, where the over-provisioning factor is a function of a ratio of a rated cooling power to a calculated cooling of the set of cooling units. The set of cooling units includes at least one cooling unit. The computer readable program code is also configured to adjusting cooling until the over-provisioning factor is substantially equal to a target over-provisioning factor.

Another embodiment of the invention is a method for controlling data center cooling. The method includes calculating, using a processor, an over-provisioning factor, where the calculated over-provisioning factor is a function of a ratio of a rated cooling power to a calculated cooling power of a set of cooling units, the set of cooing units comprising at least one cooling unit. The method further includes adjusting the data-center cooling until the calculated over-provisioning factor is substantially equal to a target over-provisioning factor.

A further embodiment of the invention is a computer program product for controlling data center cooling. The computer program product includes a computer readable storage medium having computer readable program code embodied on it. The computer readable program code is configured to calculate, using a processor, an over-provisioning factor, where the calculated over-provisioning factor is a function of a ratio of a rated cooling power to a calculated cooling of a set of cooling units, the set of cooling units comprising at least one cooling unit. The computer readable program code is further configured to adjust cooling until the calculated over-provisioning factor hits a target over-provisioning factor.

BRIEF DESCRIPTION OF THE DRAWINGS

These and other aspects, features, and advantages of the present invention will become apparent upon further consideration of the following detailed description of the invention when read in conjunction with the drawing figures, in which.

DETAILED DESCRIPTION

Embodiments of the present invention include a software tool and system to collect data and progressively shut down Computer Room Air Conditioning (CRAC) units or ramp the motor speeds of CRAC units up or down or allocate workload as needed to improve the energy efficiency of a data center. Embodiments of the invention control the CRAC units to allow for increases or decreases in the room IT power use that corresponds to increased or decreased computational work.

There are multiple ways of cooling down a data center. The most commonly used is the CRAC which uses air cooling but other methods may include using rear door heat exchangers and liquid cooling. While examples mention CRACs, embodiments of the invention can handle situations where there is an over-provisioning of cooling in other types of cooling units using either liquid or gaseous methods.

The system can calculate an over-provisioning factor (OPF) for a data center and compare it to a target OPF. The OPF can be defined as the ratio of the rated cooling power of the CRAC unit (e.g., 100 kW) divided by the calculated cooling power of the CRAC unit (e.g., 50 kW).

The target OPF is the goal to lower the OPF to. It may be selected based on the business needs of the company using the data center. For instance, where energy efficiency, environmental concerns, and cost savings are paramount the target OPF may be set low (close to 1). Where uptime and reliability of the servers is the chief concern, the target OPF may be set higher.

For example, consider a calculated OPF=2.29 (rated cooling/calculated cooling) and a target OPF=1.35. In this case ΔOPF=Calculated−Target=2.29−1.35=0.94. The Total Calculated Cooling is 822.9 kW, thus the total excess CRAC (rated) cooling that needs to be shut off is equal to ΔOPF× Total Calculated Cooling=0.94×822.9 kW=770.5 kW. A number of CRACs should be shut off such that their Total Rated Cooling=770.5 kW.

The present invention is described with reference to embodiments of the invention. Throughout the description of the invention reference is made to FIGS. 1-3. It is noted that the configurations and ordering shown is just one example of various arrangements of the present invention and should not be interpreted as limiting the invention to any particular configuration.

Figure 1:
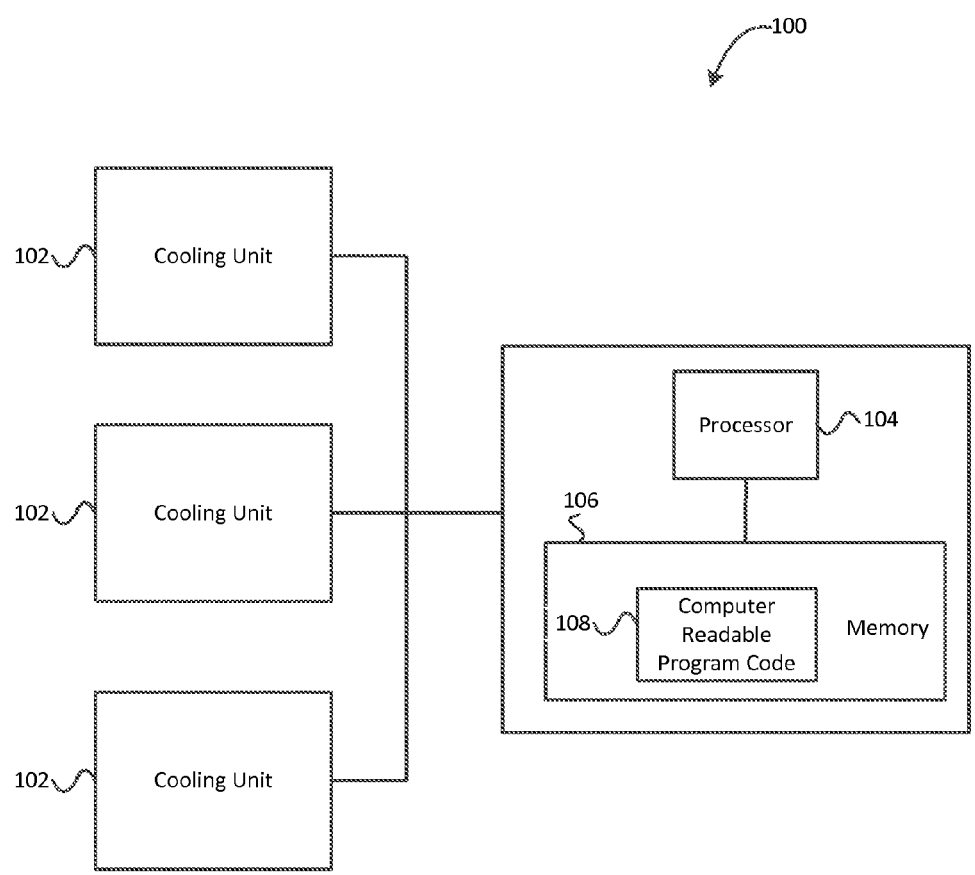
FIG. 1 illustrates an example system for controlling data center cooling.

FIG. 1 illustrates an example system for controlling data center cooling. The system 100 may include a set of cooling units 102. A processor 104 may be coupled to the set of cooling units 102. A memory 106 may be coupled to the processor 104.

The memory 106 may have computer readable program code 108 embodied on it. The computer readable program code 108 may be configured to perform various tasks for the system 100. One such task may include calculating an over-provisioning factor, where the calculated over-provisioning factor is a function of a ratio of a rated cooling power to a calculated cooling of the set of cooling units, with the set of cooling units comprising at least one cooling unit. The computer readable program code 108 may also be configured to adjust cooling until the calculated over-provisioning factor is substantially equal to a target over-provisioning factor.

Figure 2:
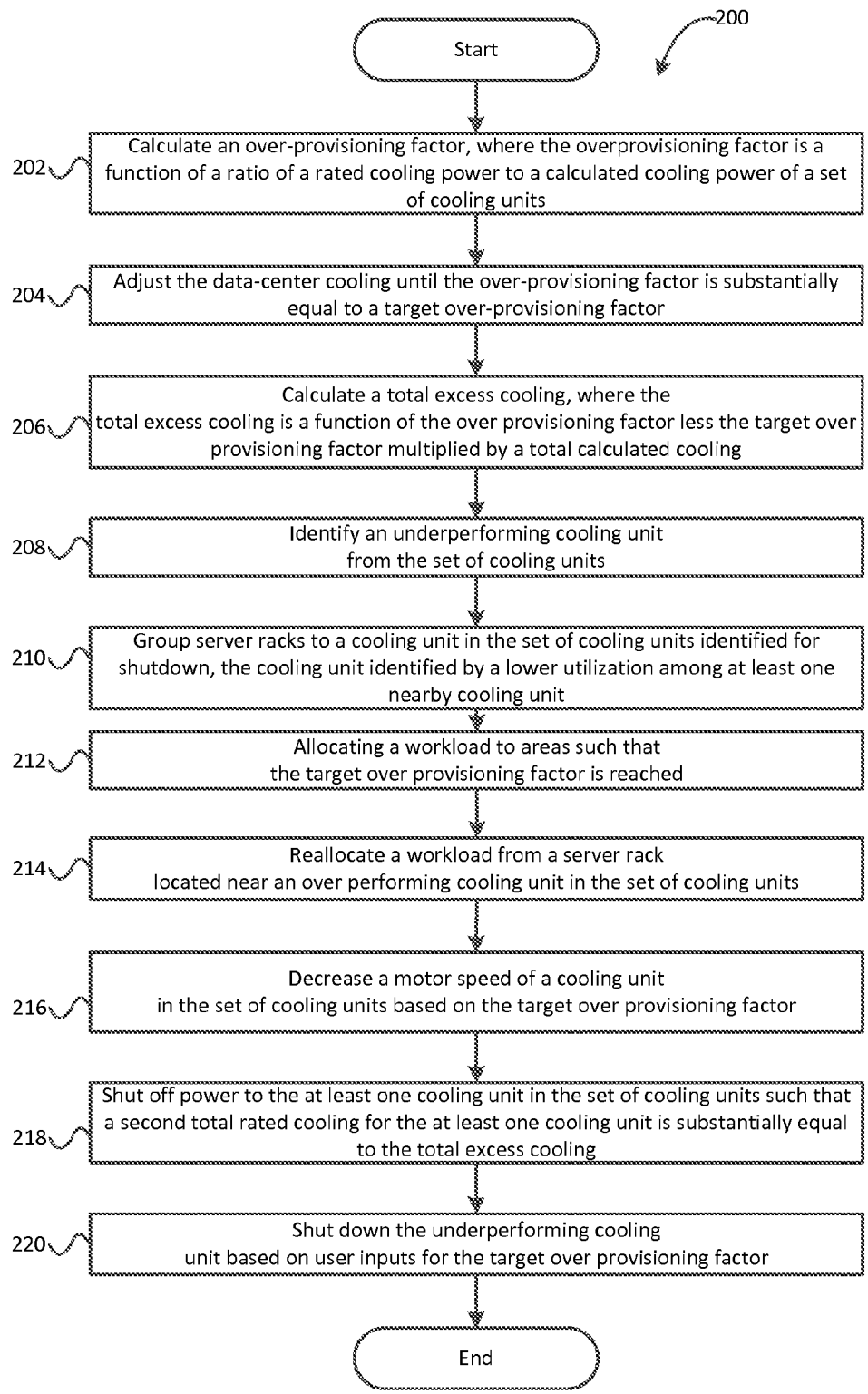
FIG. 2 is a flowchart illustrating an example method for controlling data center cooling, as contemplated by the present invention.

FIG. 2 is a flowchart illustrating an example method for controlling data center cooling, as contemplated by the present invention.

An embodiment of the method for controlling data center cooling 200 may include calculating, using a computer processor, at block 202, an over-provisioning factor, where the calculated over-provisioning factor is a function of a ratio of a rated cooling power to a calculated cooling power of a set of cooling units. The set of cooing units may include at least one cooling unit. The method 200 can continue by adjusting the data-center cooling until the calculated over-provisioning factor is substantially equal to a target over-provisioning factor, at block 204. In a further embodiment, the cooling unit may be ramped down automatically based on user inputs for the target over-provisioning factor when the rated cooling of the cooling unit is known as a function of the flow rate and measured inlet and outlet air temperature of the CRAC unit. In a particular embodiment dealing with a CRAC, this can be used when the rated cooling of the CRAC is known as a function of the CRAC airflow rate.

The method 200 may further include calculating a total excess cooling, at block 206. The total excess cooling is a function of the calculated over-provisioning factor less the target over-provisioning factor multiplied by a total calculated cooling, where the total calculated cooling is an amount of power used by the set of cooling units.

The method 200 may also include identifying an underperforming cooling unit from the set of cooling units, at block 208. At block 210, the method 200 may include grouping server racks to a cooling unit in the set of cooling units identified for shutdown. The cooling unit may be identified by a lower utilization among at least one nearby cooling unit. A further embodiment of the invention can automatically group chosen cooling units to force a minimum distance between each member of a group. The method 200 may further include, at block 212, allocating a workload to areas such that the target over-provisioning factor is reached. The method may also include reallocating a workload from a server rack located near an over performing cooling unit in the set of cooling units, at block 214. In a further embodiment workloads may be reallocated to areas near underperforming cooling units. In another embodiment of the invention reallocating the workload includes moving the workload away from a cooling influence area of the over-performing-cooling unit. The cooling influence area may be determined by changing a rectangular area around a cooling unit in the set of cooling units until an approximated averaged weighted power use of an area corresponds to a real time cooling performance of the cooling unit in the set of cooling units.

Additionally, the method 200 may include, at block 216, decreasing a motor speed of a cooling unit in the set of cooling units based on the target over-provisioning factor. The rated cooling power of the cooling unit in the set of cooling units may be a function of a flow rate of the cooling unit in the set of cooling units.

The method 200 may further include, at block 218, shutting off power to the at least one cooling unit in the set of cooling units such that a second total rated cooling for the at least one cooling unit is substantially equal to the total excess cooling. The second total rated cooling may be the total rated cooling capability of all the cooling units that are powered off. The method may also include shutting down the underperforming cooling unit based on user inputs for the target over-provisioning factor, at block 220.

Figure 3:
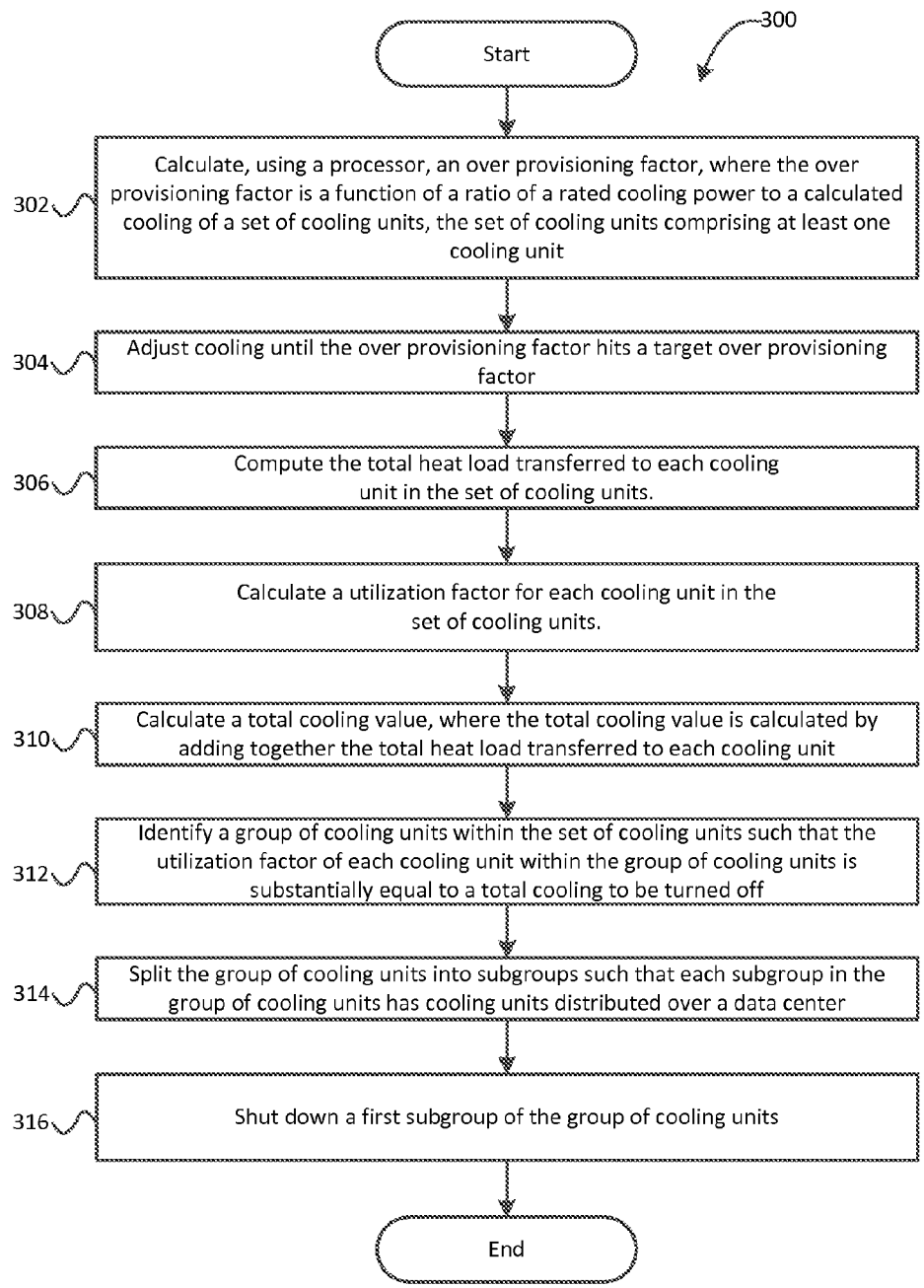
FIG. 3 is a flowchart illustrating an example method for controlling data center cooling, as contemplated by the present invention.

FIG. 3 is a flowchart illustrating an example method for controlling data center cooling, as contemplated by the present invention. An embodiment of the method for controlling data center cooling 300 may include calculating, using a processor, at block 302, an over-provisioning factor, where the calculated over-provisioning factor is a function of a ratio of a rated cooling power to a calculated cooling power of a set of cooling units. The set of cooing units may include at least one cooling unit. The method 300 can continue by adjusting the data-center cooling until the calculated over-provisioning factor is substantially equal to a target over-provisioning factor, at block 304.

In a further embodiment of the invention, the method would deploy best industry practices for dealing with cooling units such as CRACs including American Society of Heating, Refrigerating and Air-Conditioning Engineers (ASHRAE) best practices. These may include plugging cable openings, deploying blanking panels, and placing perforated tiles to supply chilled air only to inlets of racks. Additional embodiments may include measuring rack inlet temperatures. This may include measuring the inlet temperature near the top of the rack. In certain rack models this may be at a height of 6 feet 2 inches in front of every rack. Further embodiments of the invention include generating a data-center-rack-inlet-temperature profile. This profile may include rack and cooling unit layout in the data center. Further embodiments of the invention include measuring average inlet and average outlet temperatures of all CRACs when in operational mode. The profile may be analyzed to optimize shutting down cooling units.

At block 306, the method 300 continues by computing the total heat load transferred to each cooling unit. The total heat load may be calculated by the equation $Q_{Cooling}=0.56$ cfm (i.e., flow rate through the cooling unit in cubic feet per minute)$\times \Delta T$, where $\Delta T$ is the temperature decrease in Celsius across the cooling unit from inlet to discharge, for example how much the air has cooled down across a CRAC unit. $Q_{Cooling}$ may be calculated for each cooling unit. The method 300 may continue, at block 308, by calculating a utilization factor for each cooling unit in the set of cooling units. In an embodiment of the invention the utilization factor is calculated by the equation $\Phi_n = Q_{Cooling,n}/Q_n$, where $\Phi_n$ is the utilization factor the cooling unit and $Q_n$ is a catalog based cooling capability of the cooling unit.

Method 300 may continue by calculating a total cooling value, where the total cooling value is calculated by adding together the total heat load transferred to each cooling unit, at block 310. At block 312, method 300 may include identifying a group of cooling units within the set of cooling units. The group may be identified based on the utilization factor of each cooling unit where the total rated cooling of the group of cooling units is substantially equal to a total cooling to be turned off. The total rated cooling to be turned off may be calculated by multiplying the total calculated cooling by the difference between the calculated over-provisioning factor and the target over-provisioning factor.

In a further embodiment of the invention, a list of cooling units may be sorted in ascending order by utilization values. In a further embodiment the method 300 may include identifying a group of cooling units at the top of the sorted list such that the total rated cooling of this group to be turned off is equal to the excess cooling.

Method 300 may further include splitting, at block 314, the group of cooling units into subgroups such that each subgroup in the group of cooling units has cooling units distributed over a data center. At block 316, the method 300 may also include shutting down a first subgroup of the group of cooling units. In a further embodiment, cooling units are not grouped and are powered down sequentially based on utilization factor in ascending order. In a further embodiment of the invention the method 300 will stop if any of the server inlet temperatures reach a threshold value. That threshold value may be based on the needs of the business and their acceptable failure rate. The threshold value may be set to the ASHRAE recommended temperature for inlet temperature in server racks of 27° Celsius. If the method 300 stops the cooling unit closest to the high temperature rack may be turned back on. If all temperatures are below the threshold value the process may be repeated for other groups.

As will be appreciated by one skilled in the art, aspects of the invention may be embodied as a system, method or computer program product. Accordingly, aspects of the invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as OpenCL, Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preferred embodiments to the invention has been described, it will be understood that those skilled in the art, both now and in the future, may make various improvements and enhancements which fall within the scope of the claims which follow. Thus, the claims should be construed to maintain the proper protection for the invention first described.

The invention claimed is:

1. A method for controlling data center cooling, the method comprising:
    calculating, using a computer processor, an over-provisioning factor, where the calculated over-provisioning factor is a function of a ratio of a rated cooling power to a calculated cooling power of a set of cooling units, the set of cooling units comprising at least one cooling unit;

adjusting the data-center cooling until the calculated over-provisioning factor is substantially equal to a target over-provisioning factor; and calculating a total excess cooling, where the total excess cooling is a function of the calculated over-provisioning factor minus the target over-provisioning factor multiplied by a total calculated cooling, where the total calculated cooling is an amount of power cooled by the set of cooling units.

2. The method of claim 1, further comprising shutting off power to the at least one cooling unit in the set of cooling units such that a second total rated cooling for the at least one cooling unit is substantially equal to the total excess cooling, where the second total rated cooling is the amount of power used by a set of equipment generating heat.

3. The method of claim 1, further comprising identifying an underperforming cooling unit from the set of cooling units.

4. The method of claim 3, further comprising shutting down the underperforming cooling unit based on user inputs for the target over-provisioning factor.

5. The method of claim 1, further comprising grouping server racks to a cooling unit in a set of cooling units identified for shutdown, the cooling unit identified by a lower utilization among at least one nearby cooling unit.

6. The method of claim 1, further comprising decreasing a motor speed of a cooling unit in the set of cooling units based on the target over-provisioning factor, where the rated cooling power of the cooling unit in the set of cooling units is a function of a flow rate of the cooling unit in the set of cooling units.

7. The method of claim 1, further comprising reallocating a workload from a server rack located near an over performing cooling unit in the set of cooling units.

8. The method of claim 7, wherein reallocating workload includes moving the workload away from a cooling influence area of the over-performing-cooling unit, wherein the cooling influence area is determined by changing a rectangle area around a cooling unit in the set of cooling units until an approximated averaged weighted power use of an area corresponds to a real time cooling performance of the cooling unit in the set of cooling units.

9. The method of claim 1, further comprising allocating a workload to areas such that the target over-provisioning factor is reached.

10. A computer program product for analyzing energy efficiency, the computer program product comprising:

a non-transient computer readable storage medium having computer readable program code embodied therewith, the computer readable program code configured to:

calculate, using a processor, an over-provisioning factor, where the calculated over-provisioning factor is a function of a ratio of a rated cooling power to a calculated cooling of a set of cooling units, the set of cooling units comprising at least one cooling unit; and adjust cooling until the calculated over-provisioning factor hits a target over-provisioning factor, where the computer readable program product is further configured to calculate a utilization factor for each cooling unit in the set of cooling units, and where the utilization factor is calculated by the equation $\Phi_n = Q_{Cooling,n}/Q_n$, where $\Phi_n$ is the utilization factor the cooling unit and $Q_n$ is a catalog based cooling capability of the cooling unit.

11. The computer program product of claim 10, where the computer readable program product is further configured to compute a total heat load transferred to each cooling unit in the set of cooling units.

12. The computer program product of claim 11, where computing the total heat load transferred to each cooling unit is calculated by the equation $Q_{Cooling} = 0.56 \times cfm \times \Delta T$, where $\Delta T$ is a temperature decrease across the cooling unit in Celcius, and cfm is the cooling unit airflow rate in cubic feet per minute.

13. The computer program product of claim 10, where the computer readable program product is further configured to calculate a total cooling value, where the total cooling value is calculated by adding together a total heat load transferred to each cooling unit.

14. The computer program product of claim 10, where the computer readable program product is further configured to identify a group of cooling units within the set of cooling units such that the rated cooling of the group of cooling units is substantially equal to a total excess cooling to be turned off, the total excess cooling to be turned off is calculated by multiplying a total calculated cooling by the difference between the calculated over-provisioning factor and the target over-provisioning factor.

15. The computer program product of claim 14, where the computer readable program product is further configured to split the group of cooling units into subgroups such that each subgroup in the group of cooling units has cooling units distributed over a data center.

16. The computer program product of claim 15, where the computer readable program product is further configured to shut down a first subgroup of the group of cooling units.

17. A system comprising:

a set of cooling units;

a computer processor coupled to the set of cooling units;

a memory coupled to the processor, the memory having computer readable program code embodied therewith, the computer readable program code configured to:

calculate an over-provisioning factor, where the calculated over-provisioning factor is a function of a ratio of a rated cooling power to a calculated cooling of the set of cooling units, the set of cooling units comprising at least one cooling unit;

adjust cooling until the calculated over-provisioning factor is substantially equal to a target over-provisioning factor; and calculate a total excess cooling, where the total excess cooling is a function of the calculated over-provisioning factor minus the target over-provisioning factor multiplied by a total calculated cooling, where the total calculated cooling is an amount of power cooled by the set of cooling units.

\* \* \* \* \*